United States Patent [19]
Emslie et al.

[11] Patent Number: 5,134,722
[45] Date of Patent: Jul. 28, 1992

[54] AUTOMATIC GAIN CONTROL SYSTEM

[76] Inventors: Robert J. Emslie, 49 Walton Way, Shaw, Newbury, Berkshire; Robert O. Bristow, 24 Litton Road, Eastrop, Basingstoke, Hampshire RG21 2BX; Christopher N. Smith, Plot 21, Rownhams Park, Rownhams, Southampton, all of England

[21] Appl. No.: 542,728

[22] Filed: Jun. 22, 1990

[30] Foreign Application Priority Data

Jun. 23, 1989 [GB] United Kingdom ............... 8914465

[51] Int. Cl.$^5$ .............................................. H04B 1/16
[52] U.S. Cl. ................................ 455/249.1; 375/98
[58] Field of Search ............... 455/234, 235, 249, 324; 375/98

[56] References Cited

U.S. PATENT DOCUMENTS

| | | |
|---|---|---|
| 3,774,113 | 11/1973 | Chasek .................. 455/249 |
| 4,580,287 | 4/1986 | Richards, Jr. ............. 455/234 |
| 4,604,755 | 8/1986 | Murray ................... 455/235 |
| 4,811,423 | 3/1989 | Eastmond ................ 455/235 |

Primary Examiner—Curtis Kuntz
Attorney, Agent, or Firm—Leydig, Voit & Mayer

[57] ABSTRACT

An automatic gain control system handles inphase and quadrature phase signals, and is for use in digital cellular radio receiver equipment. The system comprises an inphase signal path and a quadrature phase signal path, each path including a logarithmic attenuator, the inphase and quadrature phase signal paths each including a feedforward path including a logarithmic detector. The output of the detectors are compared by respective comparators with an analogue signal, and output signals from the comparators are arranged to control a counter arrangement which generates a data word which is used to control the performance of the logarithmic attenuators.

6 Claims, 1 Drawing Sheet

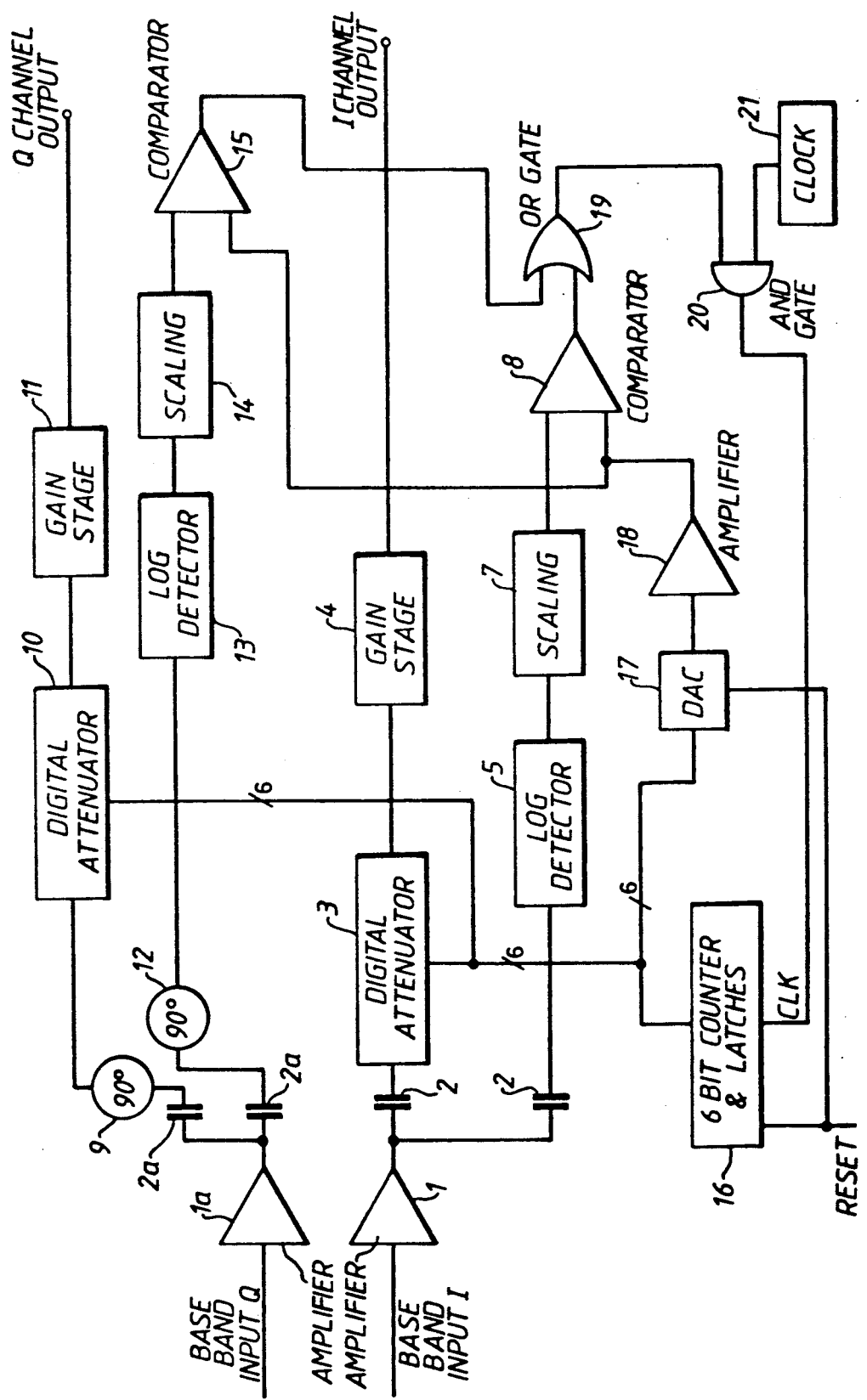

AUTOMATIC GAIN CONTROL SYSTEM

BACKGROUND OF THE INVENTION

1. Field of the Invention

The present invention relates to an automatic gain control (AGC) system for use with a receiver in digital cellular radio applications.

2. Description of the Prior Art

Known AGC systems use a feedback configuration to control their gain. If this is applied to a direct conversion receiver however, the AGC voltage has to be derived from the inphase (I) and quadrature (Q) phase components of the input signal. For stable operation the gain of the AGC loop should fall to unity well below the lowest frequency to be amplified, for example 1 KHz. The loop will therefore take many milliseconds to stabilise. Any attempt to speed up the response will result in distortion or instability.

Increasing the speed of an AGC system above that which is possible using feedback can only be achieved by the use of feedforward techniques. In such an arrangement, the input signal is split between a gain controlled amplifier and an envelope detector. The output of the envelope detector is suitably scaled and level shifted, and is used to control the amplifier gain such that the output is constant. As this is an open loop system there is no stability or distortion problems, and the response time is limited only by the time taken for the detector to reach the peak of the input waveform.

The main problem with feedforward techniques is that the gain control and detector characteristics must accurately track each other over the AGC range required. This is very difficult to achieve over more than about 20 dB in an analogue implementation, whereas the required range for digital cellular radio applications is typically nearer 80 dB. For this reason, feedforward techniques are seldom used in practice.

Accordingly, an aim of the present invention is to provide an AGC system which enables a fast settling time to be achieved and which overcomes the above mentioned problems in an efficient and simple manner.

SUMMARY OF THE INVENTION

The present invention overcomes these problems by the use of a detector providing a logarithmic response, and digitally controlled attenuators as the gain control elements.

According to the present invention there is provided an automatic gain control system for handling inphase and quadrature phase signals for use in digital cellular radio receiver equipment, the system comprising an inphase signal path and a quadrature phase signal path, each path including a logarithmic attenuator, the inphase and quadrature phase signal paths each including a feedforward path including a logarithmic detector arranged to generate an output signal, wherein said output signals are compared by respective comparators with an analogue signal, and output signals from the comparators are arranged to control a counter arrangement which generates a data word which is used to control the performance of the logarithmic attenuators.

An advantage of the present invention is the provision of an automatic gain control system having a fast settling time, enabling it to be used in digital cellular radio equipment.

BRIEF DESCRIPTION OF THE DRAWING

An embodiment of the present invention will now be described, by way of example only, with reference to the accompanying sole drawing, which is a schematic block diagram of an automatic gain control system in accordance with the embodiment of the invention.

DESCRIPTION OF THE PREFERRED EMBODIMENT

Referring to the drawing, a baseband inphase input signal I is applied to an amplifier 1. The signal passes through the coupling capacitor 2, and then down an inphase path comprising a digital logarithmic attenuator 3 and a gain stage 4, which generates the inphase channel output signal. The output from the amplifier 1 is also passed down a feedforward path comprising a logarithmic detector 5, a scaling circuit 7 and a comparator 8 via a further coupling capacitor 2.

A baseband quadrature input signal Q is passed through a quadrature channel path comprising an amplifier 1a, coupling capacitor 2a, a quadrature detector 9, a digital logarithmic attenuator 10 and a gain stage 11, the output from which provides the Q channel output. The input quadrature signal from amplifier 1a is also passed down an associated feedforward path comprising a further coupling capacitor 2a, a logarithmic detector 13, a scaling circuit 14 and a comparator 15.

A six bit counter and latch circuit 16 is connected to a digital to analogue converter 17, the output of which is amplified by amplifier 18 and passed to a second input of the comparators 8 and 15. The outputs from the scaling circuits 7 and 14, which are presented to a first input of the comparators 8 and 15, are thus compared with the amplified output from the digital-to-analogue converter 17. The output from the two comparator circuits 8 and 15 are applied to an OR gate 19, the output of which is applied to an input of an AND gate 20. A further input to the AND gate 20 receives a clock signal from a clock circuit 21. The OR gate 19 passes the stronger of the signals received from the inphase and quadrature signal paths, this signal causing the gate 20 to operate and generate a clock signal for the counter circuit 16. The output of the counter circuit is a corresponding latched digital input word which is fed to the digital attenuators 3 and 10, and is used to control the performance of these attenuators. The output of the counter circuit 16 also ramps the digital-to-analogue converter 17 output until the comparators 8 and 15 produce null outputs. This then inhibits the production of clock pulses, thus stopping the incrementing of the counter circuit 16 and the consequential ramping of the digital to analogue converter 17. The counter circuit 16 can be reset by way of a reset line as shown in the figure.

With the system described above, using the form of detector and attenuator described, the system can be made to cover a wide range by virtue of the logarithmic characteristics of the detectors 5 and 13, and of the attenuators 3 and 10. Therefore, the output of the quadrature channel and inphase channels can be held virtually constant over typically a 70 dB range.

What we claim is:

1. An automatic gain control system for handling inphase and quadrature phase signals for use in digital cellular radio receiver equipment, the system comprising an inphase signal path and a quadrature phase signal path, each signal path including a logarithmic attenuator, the inphase and quadrature phase signal paths each including a feedforward path including a logarithmic detector, a digital-analogue converter for generating an analogue signal, comparator means, and a counter arrangement, the logarithmic detector being effective to generate an output signal, said output signal being compared by the comparator means with said analogue signal, the output signals from the comparator means in the inphase signal path and the quadrature phase signal path being arranged to control the counter arrangement so as to generate a data word which is used to control the performance of the logarithmic attenuators, and thus control the gain of the system.

2. A system as claimed in claim 1, wherein the output signals from the comparator means are passed to an OR gate arranged to determine which is the greater of the two output signals from said inphase signal path and said quadrature phase signal path, and pass the greater signal to a further gate arranged to generate a clock signal for the counter arrangement.

3. A system as claimed in claim 1, wherein the output of the digital-analogue converter is caused to ramp until the comparator means inhibits the counter arrangement, and said corresponding data word generated by the counter arrangement is latched, and applied to the logarithmic attenuators to control the performance thereof.

4. A system as claimed in claim 6, wherein the output from each logarithmic attenuator is passed to a gain stage circuit, an output of which provides the associated channel output signal.

5. A system as claimed in claim 6, wherein the output from each logarithmic detector is passed through a scaling circuit prior to being presented to the associated comparator.

6. An automatic gain control system for handling inphase and quadrature phase signals for use in digital cellular radio receiver equipment, the system comprising an inphase digital signal path and a quadrature phase digital signal path, each signal path including a logarithmic attenuator, the inphase and quadrature phase signal paths each including a feedforward path including a logarithmic detector, a digital-analogue converter for generating an analogue signal, comparator means, and a counter arrangement, the logarithmic detector being effective to generate an output signal, said output signal being compared by the comparator means with said analogue signal, the output of the digital-analogue converter being caused to ramp until the comparator means in the inphase signal path and the quadrature phase signal path inhibit the counter arrangement so as to latch a data word generated by the counter arrangement which is used to control the performance of the logarithmic attenuators, and thus control the gain of the system.

* * * * *